United States Patent [19]

Sugisawa et al.

[11] Patent Number: 5,825,225

[45] Date of Patent: Oct. 20, 1998

[54] BOOSTED DIFFERENTIAL LATCH

[75] Inventors: Junji Sugisawa, Santa Clara; Jean Claude Cornet, Marina Del Rey, both of Calif.

[73] Assignee: Intel Corporation, Santa Clara, Calif.

[21] Appl. No.: 599,029

[22] Filed: Feb. 9, 1996

[51] Int. Cl.[6] .................................................. H03K 3/356
[52] U.S. Cl. ......................... 327/208; 327/309; 327/215
[58] Field of Search ................................. 327/52, 54, 55, 327/56, 57, 199, 200, 201, 203, 206, 208, 210, 211, 212, 215, 218, 219, 309, 333, 311, 390; 326/63, 93, 95, 98

[56] References Cited

U.S. PATENT DOCUMENTS

| | | | |
|---|---|---|---|
| 5,384,504 | 1/1995 | Dickinson et al. | 327/57 |
| 5,426,380 | 6/1995 | Rogers | 327/212 |
| 5,467,038 | 11/1995 | Motley et al. | 327/199 |
| 5,497,115 | 3/1996 | Millar et al. | 327/211 |
| 5,508,648 | 4/1996 | Banik | 327/219 |
| 5,557,225 | 9/1996 | Denham et al. | 327/219 |
| 5,576,651 | 11/1996 | Phillips | 327/208 |

*Primary Examiner*—Timothy P. Callahan
*Assistant Examiner*—My-Trang Nu Ton
*Attorney, Agent, or Firm*—Blakely, Sokoloff, Taylor & Zafman

[57] ABSTRACT

A data latch circuit which drives an output node to a certain value without waiting for a transition at the internal latching device. The advantage is low power consumption and high performance characteristics. The difference between a conventional differential latch and a boosted differential latch is the existence of a boosting transistor device, which allows the low power advantages of the differential latch, while improving the performance.

14 Claims, 3 Drawing Sheets

NMOS Boosted Differential Latch

PMOS Boosted Differential Latch

BOOSTED DIFFERENTIAL LATCH

FIELD OF THE INVENTION

This invention relates to the field of digital circuitry, and particularly to a differential data latch circuit.

BACKGROUND OF THE INVENTION

Differential latches are commonly used in digital data processing systems. In such a latch, the output follows the input signal while the latch is enabled. When the enable signal is removed, the data then presented at the input terminal is latched, and the output terminal remains in the state as latched, regardless of further transitions at the input terminal, until the latch is again enabled.

Differential latches are used over other types of latches, such as tri-state latches, jam latches, etc., because they have low power benefits over such latches. However, although prior art differential latches consume less power than other latches, they suffer from performance problems as compared to the other latches. Specifically, when the input of a differential latch transitions from a first state to a second state, the corresponding output transition is delayed longer in a differential latch than in a traditional latch. Furthermore, output transition delay is longer when the input transitions changes from the first state to the second state than when it changes from the second state to the first state. The difference between the two output transition delays typically results from the fact that the data propagation delay in an element depends upon the value of the data being propagated. Due to the data propagation delay of the latch components, the latch output has a different associated delay for each transition. In an NMOS differential latch which has an output signal that is an inverse of the input signal, the delay of the output signal to transition from a high to a low value is longer than the delay for that signal to transition from a low to a high value. Similarly, in a PMOS differential latch with an input and output which are inverses of each other, the delay for the output to transition from a high to a low is less than the delay to transition from a low to a high. In the PMOS differential latch, the propagation delay in an element (i.e. inverter) is greater for a transition from a low to a high value, and therefore the output fall time is faster. Therefore, due to this performance issue, it is desirable to have a low power latch which has an output transition delay from high to low and from to low to high which are comparable and which is more comparable to other latches. Thus, the low power advantages associated with differential latches will be retained, without sacrificing performance.

SUMMARY OF THE INVENTION

The present invention consists of a differential latch having a retention element, a driving element and a boosting element. While the latch is receiving an active enable signal, the driving element drives the output signal to a value corresponding to the input signal value. When the enable signal is removed, the data then presented at the input terminal is latched via the retention element. The retention element retains the input signal value located at the input terminal prior to the enable signal being removed. Regardless of further transitions at the input terminal, the retention element retains this value until the enable signal is again asserted. After the enable signal is removed, the driving element drives the output signal using the data latched in the retention element. The output signal value remains at the value of the input signal before the enable signal was removed. When the enable signal is again asserted, the driving element again drives the output signal to a value corresponding to the value of the input signal at the input terminal. However, if the input signal transitions from a second state to a first state, the boosting element pulls the output signal to the first state before the value of the input signal in the first state has propagated through the driving element. Thus, the boosting element brings the output node to the first state faster.

DETAILED DESCRIPTION OF THE INVENTION

In the following description, for purpose of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as to not obscure the description of the present invention with unnecessary detail.

Figure 1:
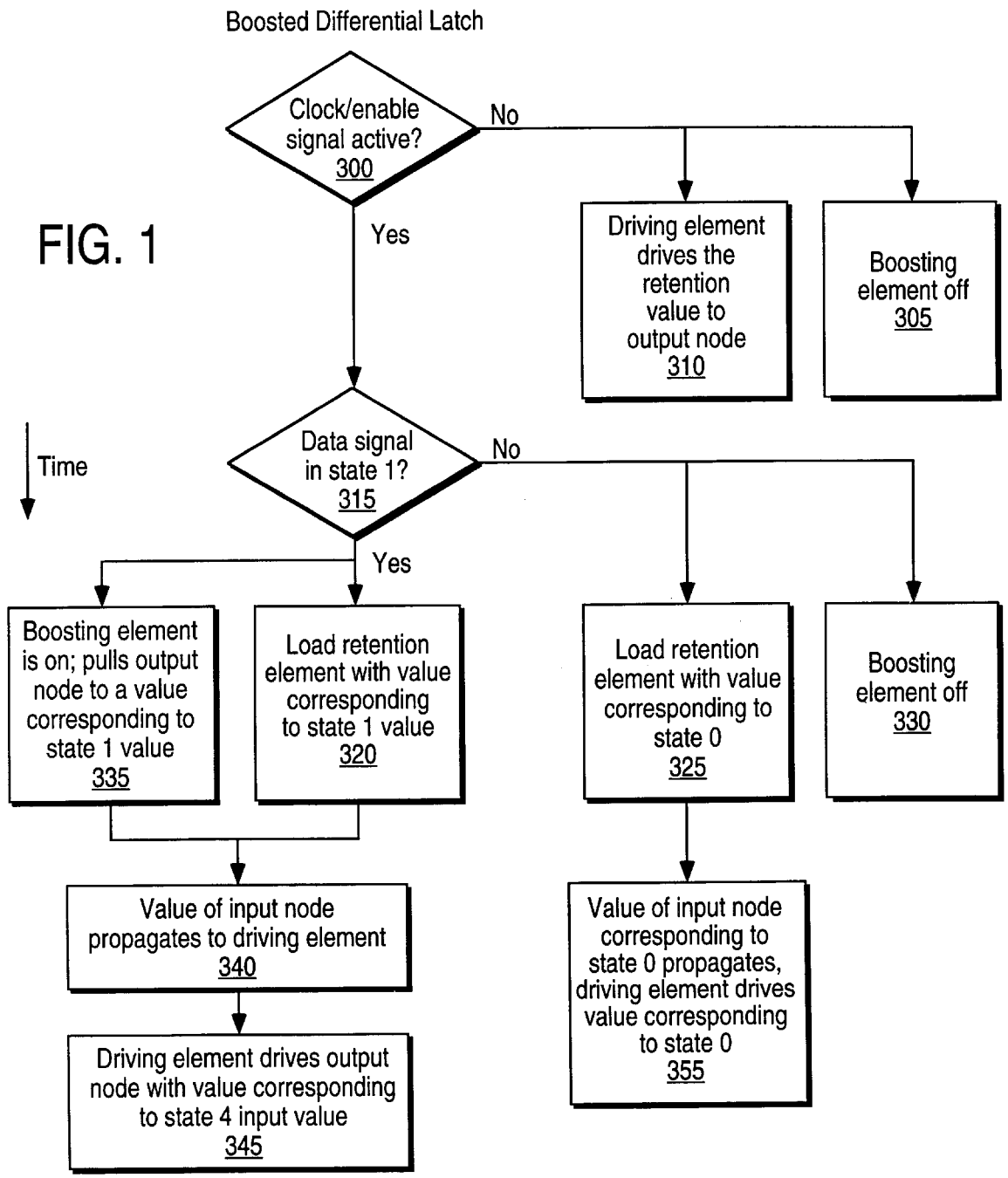
FIG. 1 is a flowchart of the operation of a NMOS boosted differential latch.
Figure 2:
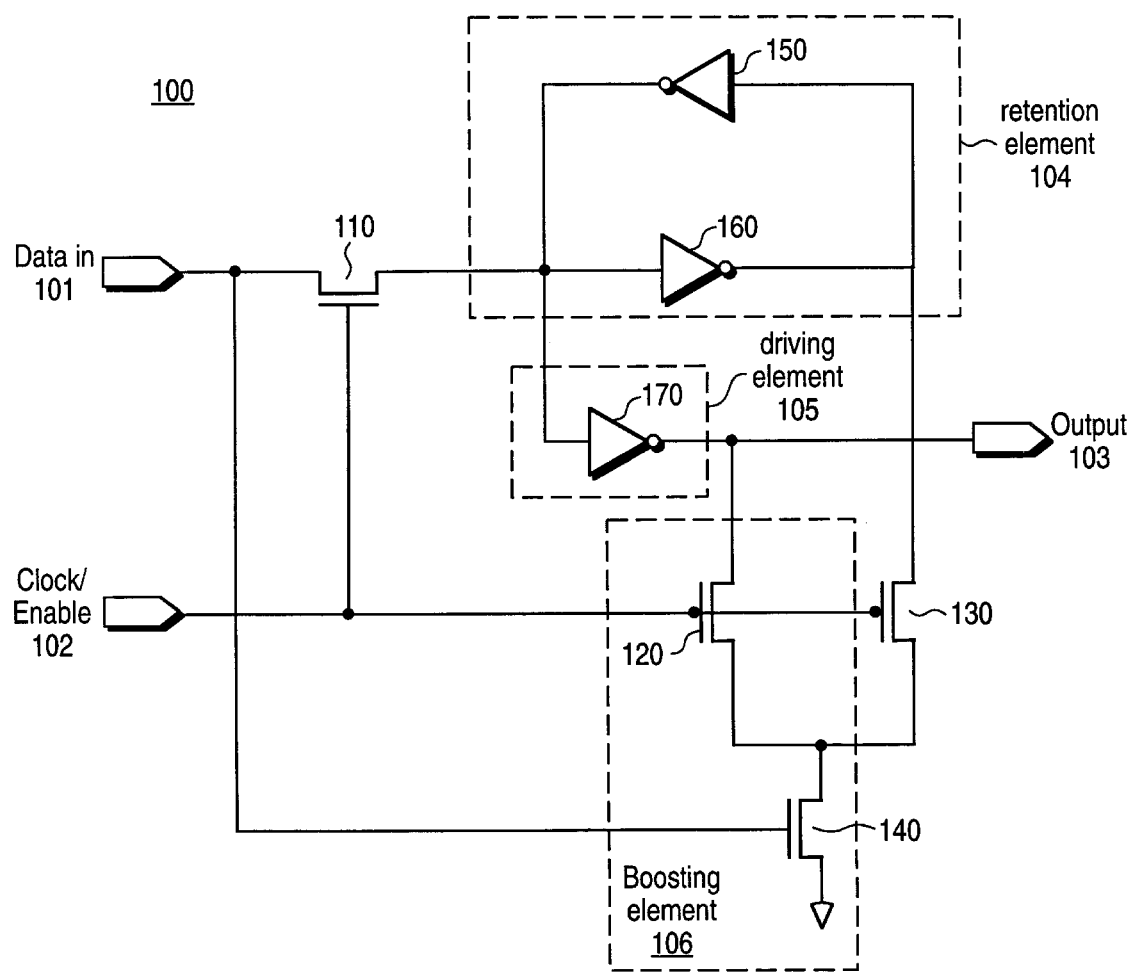
FIG. 2 is a schematic diagram of a NMOS boosted differential latch.

An illustrative boosted differential latch is shown in FIG. 2, as will be discussed in detail below. The boosted differential latch 100 consists of a retention element 104, a driving element 105 and a boosting element 106. The boosted differential latch receives an input signal and an enable/clock signal, and generates an output signal. The method of operation of the boosted differential latch is illustrated in the flowchart shown in FIG. 1. As shown, when the clock/enable signal is inactive, the boosting element is off, step 305, and the driving element drives the output node to a value corresponding to the value in the retention element, step 310. When the clock/enable signal is active, the next step is to determine what state the input data signal is in. Whether the input data signal is in state 0 (not in state 1) or state 1, the retention element is loaded with a value corresponding to the value of the input data signal (steps 320 and 325). When the input data signal is in state 0, the retention element is loaded with a value corresponding to the value of state 0, step 325. In addition, the boosting element is off, step 330. In this state (the clock/enable signal is active, the input data signal is in state 0) the value of the input data signal propagates to the driving element and the driving element drives the output node with a value corresponding to the input data signal in state 0, step 335. When the input data signal is in state 1, the retention element is loaded with a value corresponding to the value of state 1, step 320, and the boosting element is turned on, step 335. When the boosting element is turned on, step 335, it pulls the output node to a value corresponding to the value of input data signal in state 1. The boosting element pulls the output node down before the input data signal propagates to the driving element. Once the input data signal propagates to the driving element, the driving element drives the output node with a value corresponding to the value of the input data signal in state 1, step 345.

As noted previously, one embodiment of the boosted differential latch of the present invention is illustrated in FIG. 2. The boosted differential latch consists of a retention element 104, a driving element 105 and a boosting element 106. The boosted differential latch receives a data input signal and an enable/clocking signal, and generates an output signal. The data input signal is asserted at the data input terminal 101 of the boosted differential latch 100. The boosted differential latch 100 further receives the enable/clocking signal (clock signal), at the clock input terminal 102. When the clock signal is active, the driving element 105 drives the output signal, at the output terminal 103, to a value corresponding to the data input signal. When the clock signal is inactive, the retention element 104 retains the value of data input signal prior to the clock signal going inactive. Further, when the clock signal is inactive, the driving element 105 no longer drives the output signal to a value corresponding to the data input value, but instead drives the output signal to a value corresponding to the value in the retention element 104. Thus, when the clock signal is inactive, the output signal corresponds to the value of the data input signal prior to the clock signal going inactive. Therefore, since the driving element 105 drives the value in the retention element when the clock signal is inactive, transitions on the data input terminal 101 while the clock signal is inactive will not affect the output signal value.

In this particular embodiment, the output signal inversely corresponds to the input signal. If the input signal is high, the corresponding output signal is low, and similarly, if the input signal is low, the corresponding output signal is high. However, it is not necessary for the relationship between the input signal and the output signal to be inversions of each other. Instead, it is also possible that the output signal is equal to the input signal (a high input signal produces a high output signal).

If the data input signal is low while the clock signal transitions from an active state to an inactive state, the circuit latches a low value, and the output signal is high. The performance benefits of the NMOS boosted differential latch can particularly be seen when the data input signal transitions from low to high, and the enable signal transitions from inactive to active . When the data input signal transitions to a high value, transistor 140 is turned on, thus providing the low value (VSS) to the boosting element transistor 120 and transistor 130. When the clock signal subsequently transitions from inactive to active, transistors 110, 120 and 130 simultaneously turn on. This results in the boosting element transistor 120 pulling the output node to VSS (low) even though the driving element inverter 170 has not had time to transition to the new low value. Further, transistors 110 and 130 are pulling the input nodes to the retention element inverters 150 and 160 to a high and a low value, respectively. Next, inverters 150, 160 and 170 begin to drive output signals that are inversions of the respective input signals to the inverters 150, 160, 170. In the present embodiment, inverter 150 drives a high value and inverter 160 drives a low value, thus self-propagating the retention of the high value for when the enable signal becomes inactive again. In addition, the driving inverter 170 drives the output signal to a low value. Once the clock signal becomes inactive, the driving inverter 170 continues to drive a low value as it will be receiving a high value from the retention inverters (150 and 160). Also, transistors 120, 130 and 110 are turned off and no longer effect the output signal and the retention inverters, respectively.

Figure 3:
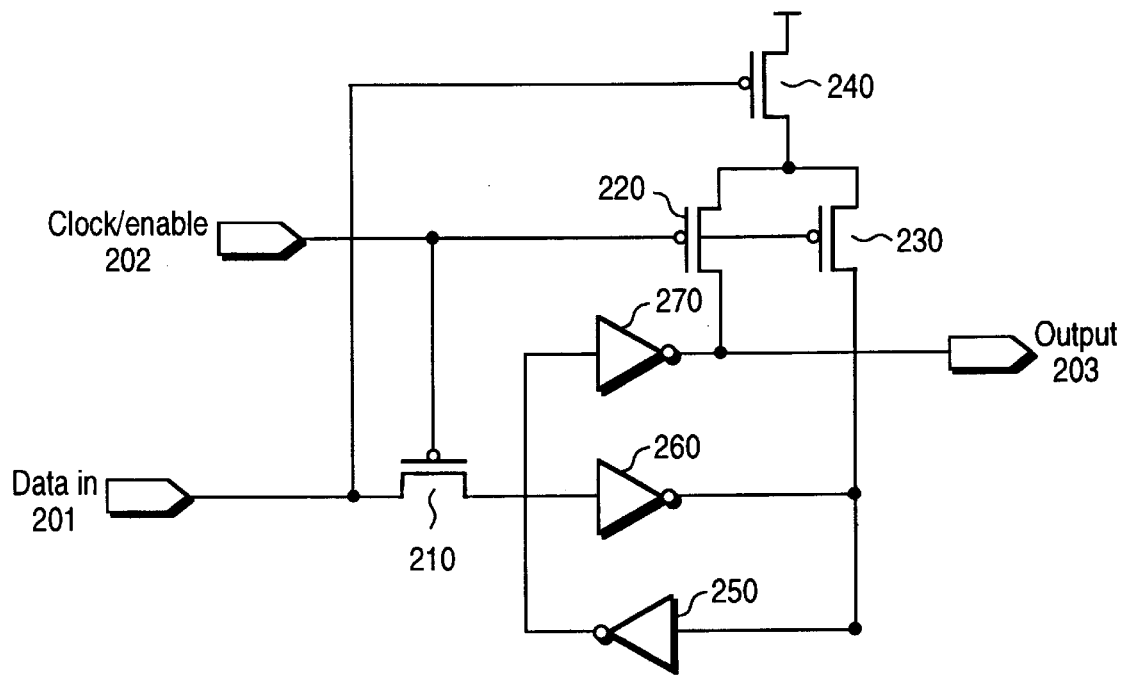
FIG. 3 is a schematic diagram of a PMOS boosted differential latch.

A similar latch can be created using PMOS devices instead of NMOS devices (see FIG. 3). In the case of the PMOS boosted differential latch, the transistor 240 (which is analogous to transistor 140 in the NMOS device) will be coupled to receive VCC (a high value) instead of VSS. Further the PMOS boosted differential latch sees added performance benefits from a data transition from high to low (as opposed to low to high).

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. A data latch circuit comprising:
    a retention element coupled to receive an input signal;
    a driving element coupled to a clocking signal, the input signal, the retention element and an output node; and
    a boosting element coupled to the clocking signal, the driving element, the input signal and the output node, the boosting element pulling the output node to a boost value when the clocking signal is active and when the input signal is in a first state, the boosting element pulling the output node to the boost value prior to the driving element driving the output node, the boost value corresponding to the input value.

2. The data latch circuit of claim 1 wherein the retention element comprises a first inverter and a second inverter, each having an output terminal coupled to an input terminal of the other of the first and second inverters for retaining the input value when the clocking signal is inactive.

3. The data latch circuit of claim 2 further comprising a switching element, the switching element allowing the input signal to pass to the retention element when the clocking signal is active.

4. The data latch circuit of claim 3 wherein the switching element is a first transistor having a gate terminal, a first terminal and a second terminal, the first terminal coupled to the input signal, the gate terminal coupled to receive the clocking signal and the second terminal coupled to the input of the first inverter and the output of the second inverter.

5. The data latch circuit of claim 2 further comprising a switching element, the switching element allowing a fixed voltage to pass to the retention element when the input signal and an output node are in a first state such that the switching element is enabled.

6. The data latch circuit of claim 1 wherein the driving element comprises a first inverter coupled to the output node.

7. The data latch circuit of claim 6 further comprising a switching element, the switching element passing the input signal to the first inverter when the clocking signal is active.

8. The data latch circuit of claim 1 wherein the boosting element comprises a first transistor and a second transistor, each transistor having a gate terminal, a first terminal and a second terminal, the first transistor and second transistor are coupled such that when the clocking signal is active, the output node is pulled to the value of the input signal before the driving element drives the output node.

9. The data latch circuit of claim 8 wherein the first transistor and the second transistor are coupled such that the first terminal of the second transistor is coupled to receive a voltage, the gate terminal of the second transistor is coupled to the input signal, the second terminal of the second transistor is coupled to the first terminal of the first transistor, the gate terminal of the first transistor is coupled to the clocking signal and the second terminal of the first transistor is coupled to the output node.

10. The data latch circuit of claim 9 wherein the output value corresponds to the input value inversely.

11. The data latch of claim 1 wherein the retention element has a retention value, the retention value results from the retention element retaining an input value corresponding to the input signal when the clocking signal is inactive.

12. The data latch of claim 1 wherein the driving element drives the output node, to an output value, the output value corresponding to an input value when the clocking signal is active, and to the retention value when the clocking signal is inactive.

13. A data latch circuit comprising:

means for retaining a retention value when a clocking signal is inactive, the means for retaining coupled with an input signal, the retention value corresponding to an input value of the input signal when the clocking signal is active;

means for driving an output node to an output value, the means for driving coupled to the means for retaining, the output value corresponding to the input value when the clocking signal is active, and to the retention value when the clocking signal is inactive; and means for boosting the output value, the means for boosting coupled to the means for retaining and the means for driving, the means for boosting pulling the output node to a boost value when the clocking signal is active prior to the driving means driving the output node.

14. A method for latching an input signal value, the method comprising the following steps:

when an enable signal is inactive:

driving an output node to a value corresponding to a retention value retained in a retention element; and turning off a boosting element when the enable signal is inactive;

when the enable signal is active and the input signal value is in a first state:

loading the retention element with the retention value, the retention value corresponding to the value of the input signal in the first state;

turning on the boosting element, the boosting element pulling an output node to an output value corresponding to the value of the input signal in the first state;

driving the output node with the driving element, the driving element driving the output node to the output value corresponding to the value of the input signal in the first state; and when the enable signal is active and the input signal value is in a second state:

loading the retention element with the retention value, the retention value corresponding to the value of the input signal in the second state;

turning off the boosting element; and driving the output node with the driving element, the driving element driving the output node to the output value corresponding to the value of the input signal in the first state.

* * * * *